United States Patent [19]

Burton et al.

[11] Patent Number: 5,476,800
[45] Date of Patent: Dec. 19, 1995

[54] METHOD FOR FORMATION OF A BURIED LAYER FOR A SEMICONDUCTOR DEVICE

[76] Inventors: Gregory N. Burton, 402 Hiller St., Belmont, Calif. 94002; Chen-Hsi Lin, 20883 Sola St., Cupertino, Calif. 95014; Chi-Kwan Lau, 13221 McDole St., Saratoga, Calif. 95070

[21] Appl. No.: 189,353

[22] Filed: Jan. 31, 1994

[51] Int. Cl.$^6$ .............................................. H01L 21/265
[52] U.S. Cl. ........................... 437/26; 437/31; 437/940; 437/924; 437/59
[58] Field of Search ............................. 437/26, 28, 38, 437/69, 940, 924, 979, 985, 40, 56, 57, 31, 59; 148/DIG. 116, DIG. 163

[56] References Cited

U.S. PATENT DOCUMENTS

| 4,745,080 | 5/1988 | Scovell et al. | 437/479 |
| 4,889,825 | 12/1989 | Parrillo | 437/28 |
| 5,055,419 | 10/1991 | Scovell et al. | 437/979 |
| 5,326,710 | 7/1994 | Joyce | 437/31 |
| 5,330,922 | 7/1994 | Erdeljac et al. | 437/59 |
| 5,358,881 | 10/1994 | Packwood | 437/31 |

FOREIGN PATENT DOCUMENTS

| 265118 | 3/1990 | Japan | 437/90 |
| 474417 | 3/1992 | Japan | 437/38 |

OTHER PUBLICATIONS

Wolf, Silicon Processing for the VLSI Era vol. 1—Process Technology, 245–248 and 256–261 copyright ®1986 by Lattice Press.

Primary Examiner—Olik Chaudhuri
Assistant Examiner—S. Mulpuri

[57] ABSTRACT

The present invention provides a buried layer fabrication sequence suitable for bipolar and BiCMOS applications. The buried layer fabrication sequence for forming a buried layer having a first conductivity type includes the steps of: forming a first dielectric layer on a semiconductor substrate, the semiconductor substrate having a second conductivity type; forming a first mask layer having openings on top of the first dielectric layer, wherein the openings in the first mask layer are positioned over the regions where the first buried layer is formed; exposing the semiconductor substrate in the regions where openings in the first mask layer are formed; forming a second dielectric layer; removing the second dielectric layer; and forming a semiconductor layer.

6 Claims, 4 Drawing Sheets

METHOD FOR FORMATION OF A BURIED LAYER FOR A SEMICONDUCTOR DEVICE

BACKGROUND OF THE INVENTION

The present invention relates to the field of semiconductor devices and their manufacture. More specifically the invention provides an improved buried layer fabrication scheme suitable for both bipolar and BiCMOS applications.

Bipolar and complimentary metal-oxide semiconductor (CMOS) devices and their fabrication are well known. Recently, bipolar and CMOS devices have been combined on a single substrate to form BiCMOS circuits. One of the first steps in the formation of both bipolar devices and BiCMOS circuits is the fabrication of the buried layer. Fabrication of the buried layer is one of the most critical steps for achieving both high yield and low manufacturing cost. In bipolar devices, the buried layer regions reduce $R_c$ (the collector resistance) by providing a low resistance path from the collector contact to the active portion of the transistor. In BiCMOS applications, the buried layer further improves the latch-up immunity of the circuit.

FIG. 1 illustrates a cross-sectional view of one method of formation of a buried layer for a bipolar device. Referring to FIG. 1A, the first step in the formation of a buried layer is the growth of a thick oxide layer 110 over the wafer substrate 112. Typically the oxide layer 110 is in the range of 5,000 to 10,000 Å. As can be seen in FIG. 1A, after formation of the thick oxide layer 110, a photoresist mask 114 is formed on the surface of the layer 110. Mask formation is followed by a series of etches to etch through the thick oxide layer 110 in areas where the buried layer is to be formed. First, a plasma etch is used to etch through the oxide layer 110 to the region immediately before the surface 116 of the substrate 112. Upon nearing the interface between the oxide region 110 and the substrate surface 116, a wet etch is performed to complete the etch to the substrate surface 116. The plasma etch is used to reduce device spacing by eliminating the undercutting typical of a wet etch. However, if allowed to reach the surface 116, the plasma etch process may extend into the substrate and damage the substrate 112. Thus a wet etch is performed to complete the etch to the surface 116 of the substrate. FIG. 1B shows the resultant structure after removal of the thick oxide layer 110 in areas where the buried layer region is to be formed.

Referring to FIG. 1C, after the step of etching the oxide layer 110 to the substrate surface 116, the photoresist layer 114 is removed and a thin oxide layer 118 is grown. The thin oxide layer 118 which is grown over the substrate surface 116 acts as a thin screen oxide for a subsequent implant step. Growth of oxide layer 118 is followed by an n+ ion implant on the order of $10^{15}$ atoms/per cubic centimeter. After the implant step, an anneal step is employed. The anneal drives the n-type dopant deeper into the substrate 112 and repairs, to a large extent, crystalline damage from the implant step. Some additional oxide is typically formed at the substrate surface 116 in this step.

After the anneal step, a third oxidation step follows resulting in an increase in the thickness of oxide layer 110 as seen in FIG. 1D. The oxidation step drives the n-type dopant (region 120) further into the substrate 112 resulting in further deepening of the buried layer 120. The oxidation step also generates a steps 124 at the silicon surface, bounding the buried layer window. The step 124 is a result of the fact that the oxidation in the field regions proceeds slowly due to the thick oxide 110, which retards the amount of oxygen reaching the silicon surface.

FIG. 1E shows the silicon wafer after removal of the oxide layer 110 and after deposition of an epitaxial layer 122. The silicon steps 124 propagate through the epitaxial layer 122 and become alignment marks for subsequent mask levels that are aligned with the buried layer 120. The epitaxial layer 122 will later be used for formation of the active regions of the bipolar devices.

One problem associated with the described buried layer fabrication process is the requirement of a dedicated plasma etch to open windows in the oxide wherever the buried layer is to be formed. A plasma etch is used instead of a chemical etch because a wet etch is isotropic and will severely undercut the oxide. Although a plasma etch will not significantly undercut the oxide layer, a plasma etch is expensive and time consuming relative to a chemical etch. Plasma etches can also cause crystalline damage and leave difficult to remove residues (e.g., polymers).

A second problem with the described buried layer fabrication process is the formation of the silicon step resulting from the growth of the second oxide layer. Although the trend today is toward planarization, the silicon step produced at the surface is typically around 1800 Å (or more). The steps provided by the process shown in FIG. 1 compromise the ability to print fine-line patterns in subsequent mask levels. This is due to light which reflects from the steps into regions which are not intended for exposure. In addition, because modern steppers have a limited depth-of-focus capability, a large step height reduces the manufacturing margin for achieving proper focus on subsequent levels.

A method of fabrication of buried layers which eliminates the dedicated plasma etch, improves planarity of the surface, and provides devices which can be fabricated more quickly and economically is needed.

SUMMARY OF THE INVENTION

The present invention provides a novel buried layer fabrication sequence suitable for bipolar and BiCMOS applications. Where the buried layer has a first conductivity type, the buried layer fabrication sequence includes the steps of: forming a first dielectric layer on the surface of a semiconductor substrate, the semiconductor substrate having a second conductivity type; forming a first mask layer having openings on top of the first dielectric layer, wherein the openings in the first mask layer are positioned over the regions where the first buried layer is to be formed; exposing the semiconductor substrate to a dopant having a first conductivity type; forming a second dielectric layer; removing the second dielectric layer; and depositing a semiconductor layer.

The first step for formation of the buried layer for a bipolar device is the growth of a thin dielectric layer on top of a semiconductor substrate, typically silicon. The dielectric formed is a typically a thin layer of silicon dioxide ($SiO_2$) having a thickness in the range of 100–200 Å. Next, a mask layer is formed on the surface of the dielectric surface. The mask layer has openings which correspond to regions where the first buried layer is to be formed. It is through the openings in the mask layer that the semiconductor substrate is exposed to a dopant having a first conductivity type. Typically the mask layer is comprised of photoresist. The dopant is typically introduced by application of an ion implant step.

After stripping off the mask layer from the surface of the dielectric layer, the wafer goes through an oxidation drive-in step that simultaneously drives-in the dopant, grows a second oxide layer, and anneals out existing crystalline defects. Thus the buried layer is formed in the implanted region. Due to dopant enhanced oxidation, the implanted region grows a thicker oxide than the masked region creating a shallow silicon step. After the oxidation drive-in step, the oxide is removed and a semiconductor layer is formed, typically by epitaxial deposition of silicon. The epitaxial layer will be used for later formation of the active regions of the bipolar devices.

In a second embodiment, additional steps are added to the previously described process to form a buried layer for BiCMOS applications. BiCMOS technology offers the advantages of the high packing density and low power consumption of CMOS devices, as well as the high speed of bipolar devices. However techniques required to fabricate the bipolar transistor are at times incompatible or difficult to use with fabricating CMOS devices. In the present process, steps are added to the first described process after the step of removing the second dielectric layer. The added steps include the steps of growing a fourth dielectric layer and forming a region having a second conductivity type.

For BiCMOS circuits, buried layer regions having both a first and second conductivity type are needed. After forming the buried layer of the first conductivity type, the dielectric layer formed in the oxidation drive-in step is removed and a fourth dielectric layer is grown. The p-type buried layer is formed in a self-aligned manner by performing a blanket (unmasked) p-type implant. After the p-type implant, the fourth dielectric layer is removed and a semiconductor layer of silicon is deposited. The deposited epitaxial silicon layer is used for formation of the active regions of the bipolar and CMOS circuits.

The new buried layer fabrication method eliminates the need for the thick initial oxidation step, the costly plasma etch step, and the patterned wet etch step, resulting in a process which is less expensive and easier to manufacture. In addition, the silicon step, necessary for later photolithographic alignment, is reduced in magnitude and formed automatically during the oxidation drive-in step. In addition, a second embodiment of the invention requires only one mask layer to form both the p-type region and n-type buried regions necessary for a BiCMOS device.

A further understanding of the nature and advantages of the present invention may be realized by reference to the remaining portions of the specification and the attached drawings.

DESCRIPTION OF THE PREFERRED EMBODIMENTS

FIG. 2 illustrates a fabrication sequence for the buried layer of a bipolar device according to one embodiment of the invention. The buried layer fabrication sequence for a bipolar device includes the steps of: forming a first dielectric layer on a semiconductor substrate, the semiconductor substrate having a second conductivity type; forming a first mask layer having openings on top of the first dielectric layer, wherein the openings in the first mask layer are positioned over the regions where the first buried layer is to be formed; exposing the semiconductor substrate to a dopant having a first conductivity type in regions where the openings in the first mask layer are formed; forming a second dielectric layer; removing the second dielectric layer; and forming a semiconductor layer.

Figure 1A:
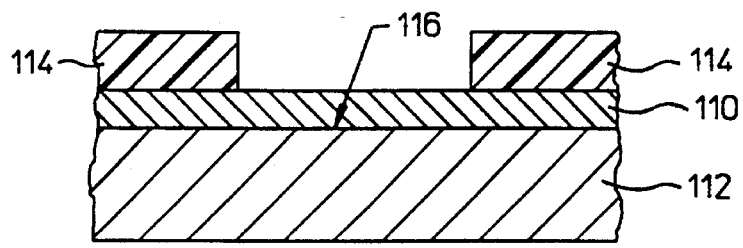
FIGS. 1A–E illustrate a cross-sectional view of the formation of a buried layer for a bipolar device according to the prior art.
Figure 1B:
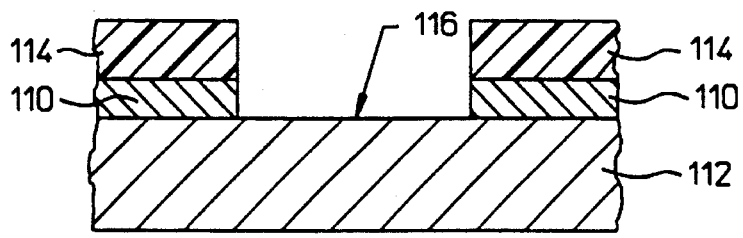
Figure 1C:
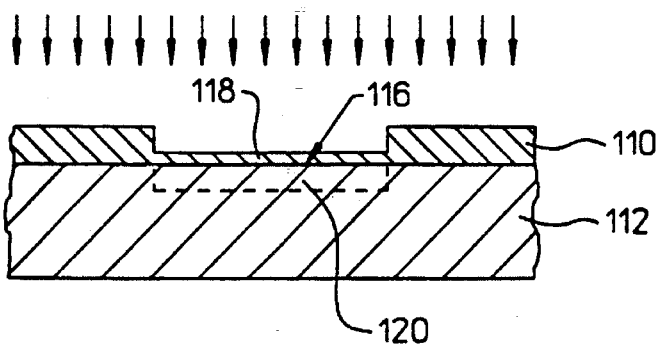
Figure 1D:
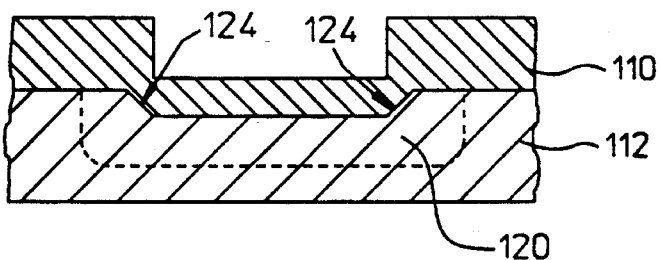
Figure 1E:
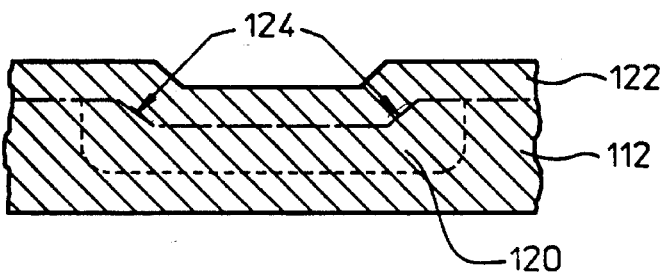
Figure 2A:
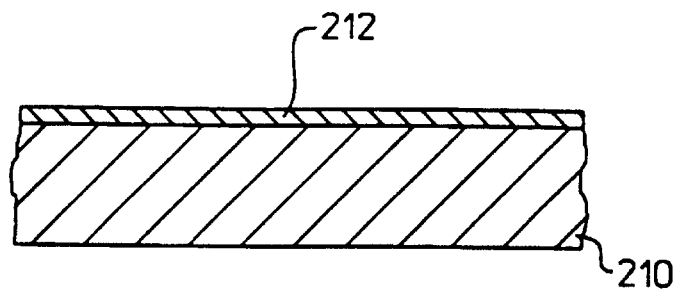
FIGS. 2A–G illustrate a cross-sectional view of the fabrication of the buried layer for a bipolar device according to the present invention.

FIG. 2A illustrates a substrate 210 used for formation of the buried layer. Typically the semiconductor substrate 210 is formed from a p-type 6 inch diameter wafer having a (100) crystalline orientation. The first step in the formation of the buried layer according to the present invention is formation of a dielectric layer on the semiconductor substrate 210. A thin dielectric layer 212, typically silicon dioxide in the range of 50 to 300 Å, is grown on the surface of the substrate 210. The thin silicon dioxide layer 212 typically has a thickness of 120 Å and is grown using techniques well known in the art. In one embodiment, the silicon dioxide layer 212 is formed by placing the wafer in a furnace for 10 minutes in a dry oxygen environment followed by 16.5 minutes in a steam environment at approximately 805° C.

Figure 2B:
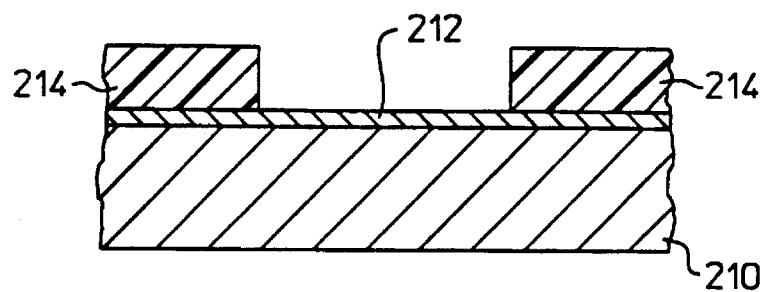

Referring to FIG. 2B, after formation of the oxide layer 212 a photoresist mask 214 is formed on the surface of the oxide layer 212 using techniques well known in the art. In one embodiment, the photoresist mask 214 is typically formed by spinning a layer of photoresist to a thickness of approximately 1 micron. Deposition of the photoresist layer 214 is followed by a soft bake and exposure of the desired masking pattern with G-line radiation. The photoresist layer 214 is then hard baked for approximately 80 seconds under intense ultraviolet illumination. Exposure of the photoresist mask layer 214 to light creates openings in the photoresist mask 214. The openings are positioned over the regions where the buried layer is to be formed.

Figure 2C:
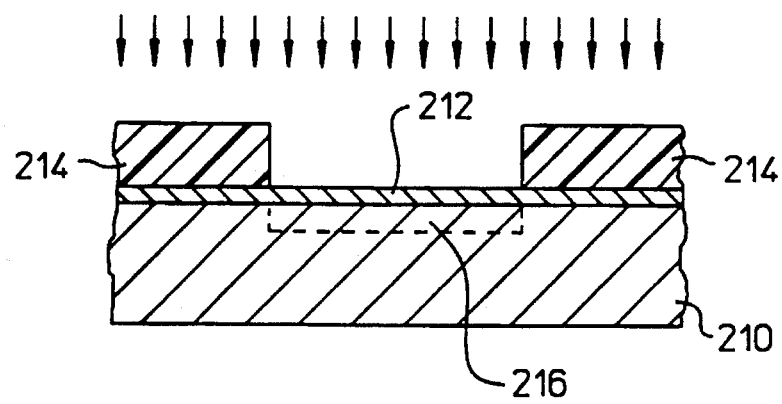

Referring to FIG. 2C, the photoresist mask 214 is used as an implant mask in the formation of a buried layer of a first conductivity type in a substrate having a second conductivity type. In the present case, an n-type buried layer is formed in the p-type substrate. In one embodiment, the implant energy used for the n-type dopant is between 60 and 200 KeV with a preferred implant energy of 100 KeV. Typically arsenic is used as a dopant, however any n-type dopant may be used. The dopant concentration of the arsenic impurity is typically between about $1.0 \times 10^{15}$ atoms/cubic centimeter and $1.0 \times 10^{16}$ atoms/cubic centimeter, preferably having a dosage of $5.0 \times 10^{15}$ atoms/cubic centimeters. The arsenic impurities 216 will convert the silicon to an n-type region upon subsequent furnace cycles.

Figure 2D:
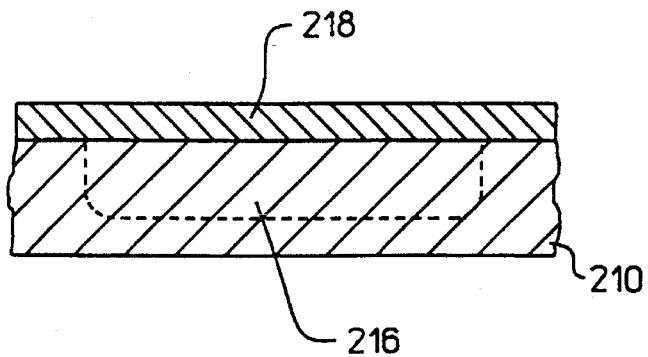

After the implant step shown in FIG. 2C, the photoresist mask 214 is stripped using techniques well known in the art. Removal of the photoresist mask 214 is followed by a buried layer drive-in step. The buried layer drive-in is a high temperature diffusion process that drives the implanted arsenic atoms deeper into the silicon substrate 210. Typically the buried layer drive-in is achieved by placing the wafer into a furnace under varied time and environmental conditions. The wafer is placed in the furnace for varied times in a furnace having temperatures typically ranging from 1000° C. to 1125° C. The different furnace environmental conditions may include a nitrogen environment, a dry oxygen environment, or alternatively a steam environment. The buried layer drive-in process results in an oxide layer 218 having a height of approximately 3000 Å and creates n-type diffusion regions 216 as shown in FIG. 2D. The oxide layer 218 does not result in an appreciable step at the surface of the silicon substrate 210 since there are only minimal concentration-enhancement effects at the high temperatures used in the drive-in step.

The buried layer drive-in step is followed by a buried layer oxidation step which creates a step in the surface of the silicon substrate 210. The combination of the buried layer drive-in step and the buried layer oxidation step is sometimes referred to as the oxidation drive-in step. Although like the buried layer drive-in step, the buried layer oxidation step may be formed under varied time and environmental conditions, the oxidation step is performed at lower temperatures than the drive-in step to create an appreciable silicon step. The drive-in step is typically performed at temperatures ranging from 1000° C. to 1125° C. while the oxidation step is typically performed at temperatures less than 950° C.

Figure 2E:
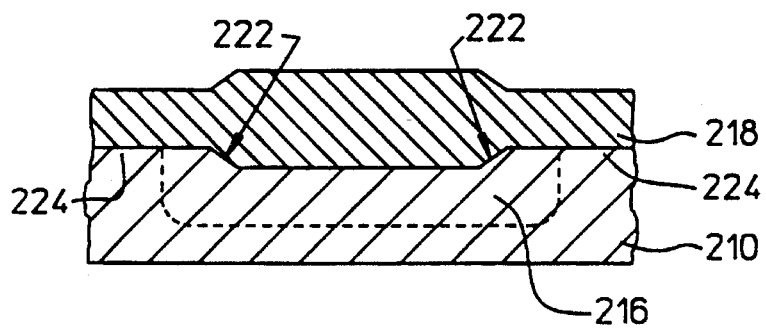
Figure 2F:
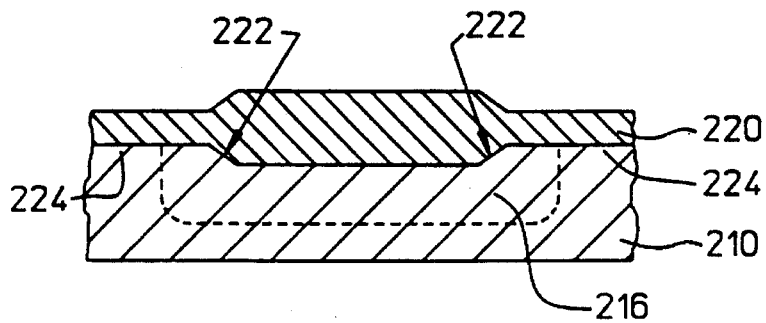

The formation of the oxide layer 218 shown in FIG. 2D is followed by either the steps necessary for formation of the structures shown in FIG. 2E or FIG. 2F. In the first embodiment shown in FIG. 2E, the oxide layer 218 is not removed before the buried layer oxidation step. In the second preferred embodiment shown in FIG. 2F, the oxide layer 218 formed in the buried layer drive-in step is removed before the buried layer oxidation step.

In the embodiment shown in FIG. 2E, the oxide layer 218 is not removed before the buried layer oxidation step. Instead, the wafer is placed in a steam furnace for approximately 100 minutes at 950° C. followed by a 35 minute heating in a dry oxygen environment at 950° C. resulting in a continuation of growth of oxide layer 218. It is well known that when growing silicon dioxide on a silicon surface, the silicon consumed is equal to approximately 44% of the silicon dioxide thickness grown. The oxidation proceeds more rapidly on the heavily doped buried layer regions thereby creating a visible step-height 222 at the boundary of these areas. The buried layer oxidation step grows approximately 6000 Å of $SiO_2$ over the buried layer regions 216 and approximately 4200 Å over the undoped silicon regions 224. In combination with the previously grown oxide in the buried layer drive-step, the oxide layer 218 is approximately 9000 Angstroms over the buried layer regions 216 and approximately 7200 Å over the undoped silicon region 224. The step-height 222 created at the silicon surface by the oxide thickness differential is approximately 800 Å in magnitude. The step-height allows subsequent mask levels to be aligned to the buried layer pattern.

In the second embodiment shown in FIG. 2F, the oxide layer 218 formed in the buried layer drive-in step is removed before the buried layer oxidation step. After the buried layer drive-in, the oxide layer 218 is removed. The oxide layer 218 is typically removed by dipping the wafer into a 10:1 mixture of de-ionized water and hydrofluoric acid for approximately 20 minutes at 20° C.

After the oxide layer 218 is stripped from the substrate surface, a thick oxide 220 is grown on the wafer surface as shown in FIG. 2F. Formation of the oxidation layer 220 during the buried layer oxidation step is follows the previously described process for the continued growth of layer 218 with respect to the embodiment shown in FIG. 2E. The wafer is placed for approximately 100 minutes at 950° C. in a steam furnace followed by a 35 minute heating in a dry oxygen environment at 950° C. The oxidation proceeds more rapidly on the heavily doped buried layer regions thereby creating a visible step-height 222 at the boundary of these areas. The furnace operation grows approximately 6000 Å of $SiO_2$ over the buried layer regions 216 and approximately 4200 Å over the undoped silicon regions 224. The step-height 222 created at the silicon surface by the oxide thickness differential is approximately 800 Å in magnitude. The step-height allows subsequent mask levels to be aligned to the buried layer pattern.

Figure 2G:
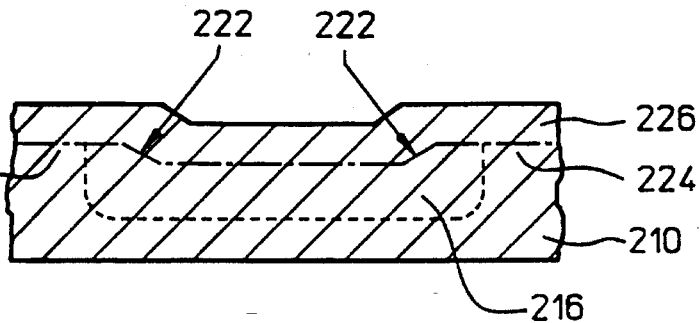

Both the processes shown in FIG. 2E and 2F result in formation of silicon steps 222. Both FIGS. 2E and 2F are followed by the process steps necessary for the formation of the structure shown in FIG. 2G. Namely, after the buried layer oxidation step shown in both FIGS. 2E and 2F, the oxide layer 218 in FIG. 2E and the oxide layer 220 shown in FIG. 2F are removed from the silicon substrate. The oxide layer 218 in FIG. 2E or 220 in FIG. 2F is typically removed by dipping the wafer into a 10:1 mixture of de-ionized water and hydrofluoric acid for approximately 30 minutes at room temperature to completely remove the silicon dioxide layer from the silicon surface. After removal of the oxide layer 218 in FIG. 2E or 220 in FIG. 2F, an epitaxial layer 226 of a semiconductor material such as silicon is deposited on the wafer surface as seen in FIG. 2G. The epitaxial layer 226 is used for formation of active regions of the bipolar device.

FIG. 3 is a cross-sectional view of the fabrication of the buried layer for a BiCMOS application according to the preferred embodiment of the present invention. Additional steps are needed to form a BiCMOS device compared to the previously described process to form a buried layer for a bipolar device. The additional process steps occur after the step of removing the second dielectric layer. The added process steps include: growing a fourth dielectric layer, exposing the semiconductor substrate to a dopant having a second conductivity type; and removing the fourth dielectric layer. Thus the buried layer fabrication sequence for a BiCMOS circuit includes the steps of: forming a first dielectric layer on a semiconductor substrate, the semiconductor substrate having a second conductivity type; forming a first mask layer having openings on top of the first dielectric layer, wherein the openings in the first mask layer are positioned over the regions where the first buried layer is to be formed; exposing the semiconductor substrate to a dopant having a first conductivity type; forming a second dielectric layer; removing the second dielectric layer; growing a fourth dielectric layer; forming a second mask layer having openings on top of the fourth dielectric layer, wherein the openings in the second mask are positioned over regions where a buried layer having a second conductivity type is to be formed; exposing the semiconductor substrate to a dopant having a second conductivity type; and forming a semiconductor layer.

Figure 3A:
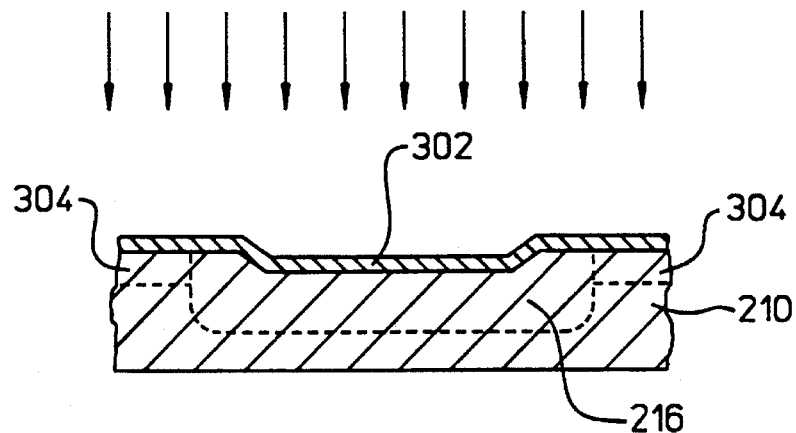
FIGS. 3A–B illustrate a cross-sectional view of the fabrication of the buried layer for a BiCMOS application according to the present invention.

For BiCMOS circuits, a buried layer of both first and second conductivity type are needed. FIG. 3A shows a cross-sectional view of the wafer after formation of the first buried layer. The structure shown in FIG. 3A is formed following the process for formation of the structure shown in either FIG. 2E or 2F. To form the structure shown in FIG. 3A, the second dielectric layer 218 shown in FIG. 2E or alternatively the third dielectric layer 220 shown in FIG. 2F is removed and a fourth thin dielectric layer 302 is grown. Removal of the dielectric layer 218 or alternatively 220 is typically performed by immersing the wafer in a 10:1 mixture of de-ionized water and hydrofluoric acid for approximately 20 minutes at 20° C. The fourth dielectric layer 302 is typically a thin implant screen oxide layer having a thickness of approximately 100 to 200 Å. In one embodiment, the implant screen oxide 302 is grown by placing the wafer in a furnace in a dry oxygen environment followed by a second heating step in a steam environment.

After formation of the fourth dielectric layer 302, the resultant structure is exposed to a dopant having a second conductivity type. Typically, the structure is exposed to the dopant by an ion implantation step. The p-type ion implant is performed using an implant energy of about 20–60 KeV with a dopant dosage of approximately $1\times10^{12}$ atoms/cubic centimeters. The resultant concentration in the p-type buried layer region 304 is typically on the order of $1\times10^{16}$ atoms/cubic centimeters. The p-type buried layer is formed in a self-aligned manner by performing a blanket (unmasked) p-type implant. The p-type implant compensates for future n-type "contamination" which occurs in the field regions during subsequent epitaxial silicon deposition, the "autodoping" phenomenon.

Figure 3B:
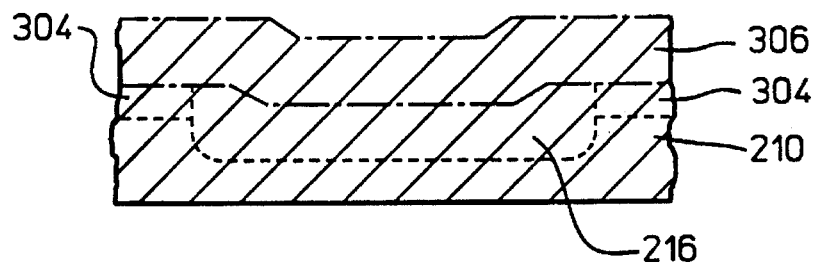

After the compensation implant, the oxide layer 302 is stripped by placing the wafer into a 10:1 mixture of deionized water and hydrofluoric acid for about 1.5 minutes. Referring to FIG. 3B, after stripping the oxide layer 302, a layer of a semiconductor material 306 is formed. Typically, the semiconductor material is silicon which is deposited epitaxially. The epitaxial silicon layer 306 is used for formation of the active regions of the bipolar and CMOS devices and has the same conductivity as the substrate 210.

The invention has now been described with reference to specific embodiments. Other embodiments will be apparent to those of ordinary skill in the art. For example, other n and p-type species may be used for the buried layer region, different conductivity ranges may be used, and there may be variations in the heat cycle or varying thicknesses of the oxide grown. It is therefore not intended that his invention be limited, except as indicated in the appended claims.

What is claimed is:

1. A method of formation of a buried layer having a first conductivity type for a semiconductor circuit, comprising the steps of:

(a) forming a first dielectric layer on a semiconductor substrate having a second conductivity type;

(b) forming a mask layer having openings on top of the first dielectric layer, wherein the openings in the mask layer are positioned over the regions where the buried layer is to be formed;

(c) implanting a dopant having a first conductivity type in regions where openings in the mask layer are formed;

(d) removing the mask layer;

(e) forming a second dielectric layer on the surface of the semiconductor substrate, wherein the second dielectric layer is formed during an oxidation drive-in step;

(f) forming a third dielectric layer on the surface of the semiconductor substrate, wherein the third dielectric layer is formed during the buried layer oxidation step, wherein the buried layer oxidation step includes the step of placing the semiconductor wafer in a furnace having a temperature less than 950 degrees Celsius;

(g) removing the third dielectric layer from surface of the semiconductor substrate; and (h) forming a semiconductor layer on the surface of the semiconductor substrate.

2. The method recited in claim 1 wherein the first dielectric layer is between 100 to 200 Angstroms.

3. The method recited in claim 1 therein the oxidation drive-in step includes placing the semiconductor wafer in a furnace having a temperature in the range of 1000 to 1125 degrees Celsius.

4. The method recited in claim 1 further including the step of removing the second dielectric layer, wherein the step of removing the second dielectric layer is performed before the step of forming a third dielectric layer, wherein the third dielectric layer is formed on the surface of the substrate.

5. A method of formation of a first buried layer having a first conductivity type and a second buried layer having a second conductivity type for a semiconductor circuit, comprising the steps of:

(a) forming a first dielectric layer on a semiconductor substrate having a second conductivity type;

(b) forming a mask layer having openings on top of the first dielectric layer, wherein the openings in the mask layer are positioned over the regions where the first buried layer is to be formed;

(c) implanting a dopant having a first conductivity type in regions where the openings in the mask are formed;

(d) forming a second dielectric layer on the surface of the semiconductor substrate, wherein the second dielectric layer is formed during a buried layer drive-in step and a buried layer oxidation step, wherein the buried layer oxidation step includes the step of placing the semiconductor substrate in a furnace having a temperature less than 950 degrees Celsius;

(e) removing the second dielectric layer;

(f) growing a third dielectric layer;

(g) performing a blanket implant with a dopant having a second conductivity type to form the second buried layer; and (h) forming a semiconductor layer on the surface of the semiconductor substrate.

6. The method recited in claim 5 therein the buried layer drive in step includes placing the semiconductor substrate in a furnace having a temperature in the range of 1000 to 1125 degrees Celsius.

* * * * *